US008536960B2

(12) United States Patent
Immonen et al.

(10) Patent No.: US 8,536,960 B2
(45) Date of Patent: Sep. 17, 2013

(54) FILTER STRUCTURE

(75) Inventors: Pentti Immonen, Espoo (FI); Jarno Tervo, Helsinki (FR)

(73) Assignee: Tellabs Oy, Espoo (FI)

( * ) Notice: Subject to any disclaimer, the term of this patent is extended or adjusted under 35 U.S.C. 154(b) by 407 days.

(21) Appl. No.: 12/607,515

(22) Filed: Oct. 28, 2009

(65) Prior Publication Data

US 2010/0109813 A1     May 6, 2010

(30) Foreign Application Priority Data

Oct. 28, 2008  (FI) ..................... 20086018

(51) Int. Cl.
*H01P 1/203* (2006.01)
*H01P 7/08* (2006.01)

(52) U.S. Cl.
USPC .......................................... 333/204; 333/219

(58) Field of Classification Search
USPC ................... 333/204, 219, 205, 235
See application file for complete search history.

(56) References Cited

U.S. PATENT DOCUMENTS

| | | | |
|---|---|---|---|
| 2,411,555 A | 11/1946 | Rogers | |
| 3,879,690 A | 4/1975 | Golant et al. | |
| 4,233,579 A | 11/1980 | Carlson et al. | |
| 2007/0090398 A1* | 4/2007 | McKinzie, III | 257/192 |
| 2008/0072204 A1 | 3/2008 | Chen | |
| 2008/0158840 A1 | 7/2008 | Chen et al. | |
| 2010/0060527 A1* | 3/2010 | Kim et al. | 343/700 MS |

FOREIGN PATENT DOCUMENTS

WO  2007047891 A2   4/2007

OTHER PUBLICATIONS

Toyota et al., "Size Reduction of Electromagnetic Bandgap (EBG) Structures with New Geometries and Materials", 2006 Electronic Components and Technology Conference, Jul. 2006, pp. 1784-1789.*
Patnam et al., "Compact Electromagnetic Bandgap Structure for Noise Suppression in Power Plane,", Advanced Packaging and Systems Symposium, EDAP 2008, Dec. 10-12, 2008, pp. 13-15.*
Finnish Search Report dated Jul. 10, 2009, from corresponding Finnish application.
European Search Report in Corresponding Application No. EP 09172413 dated Mar. 8, 2010.

* cited by examiner

*Primary Examiner* — Benny Lee
*Assistant Examiner* — Gerald Stevens
(74) *Attorney, Agent, or Firm* — Young & Thompson

(57) ABSTRACT

In a filter structure for suppressing a spurious signal, a conductor layer in a printed circuit board includes a pattern with interconnected pattern elements (106 to 114). A pattern element includes a low-impedance conductive region (119) the capacitance of which against a second conductor layer of the printed circuit board is dominant over the inductance. A pattern element includes at least two adjacent high-impedance conductor strips (115, 116) in a first direction, connected to a low-impedance conductive region, and at least two adjacent high-impedance conductor strips (117, 118) in a second direction, connected to the low-impedance conductive region. The inductance of each high-impedance conductor strips is dominant over the capacitance against the second conductor layer. The high-impedance conductor strips form together with the low-impedance conductive region a plurality of resonance points in the frequency range, thus achieving sufficient stop-band width.

20 Claims, 6 Drawing Sheets

FILTER STRUCTURE

FIELD OF THE INVENTION

The invention relates to a filter structure for suppressing a spurious signal coupled between the conductor layers of a printed circuit board. The invention also relates to a method for suppressing a spurious signal coupled between the conductor layers of a printed circuit board. The invention further relates to an electronic apparatus.

BACKGROUND OF THE INVENTION

The trend in electronic equipment is towards higher clock frequencies and lower voltage levels. As a consequence, electronic apparatus become more and more susceptible to external electromagnetic interference and, on the other hand, they themselves produce more electromagnetic interference. The conductor layers of a printed circuit board form a waveguide which is capable of carrying high-frequency electromagnetic disturbances. For example, the power supply layer and the power supply ground plane can carry high-frequency electromagnetic disturbances to the power supply terminals of circuit components, causing the supply voltage of the circuit components to deviate from the desired value. When the value of the supply voltage differs too much from the desired value the circuit component will cease to function in the desired manner.

Supply voltage disturbances are generally suppressed using a capacitor connected to the power supply terminals of the circuit component, with the idea of providing a low-impedance bypass route for the spurious signals. A problem with capacitor-based noise suppression is the parasitic series inductance of the capacitor the effect of which increases as the frequency rises. Therefore, capacitor-based noise suppression usually no longer works in the desired manner when the noise appears at high frequencies.

An alternative solution for noise suppression is provided by a filter structure integrated in the printed circuit board, implementable with the electromagnetic band-gap (EBG) structure. The structure is designed to produce a stop-band in the frequency region where the spurious signals appear. A mushroom type filter structure comprises periodic conductive areas and feedthrough connections between the conductor layers of the printed circuit board which together with the conductor layers form a noise-suppressing filter. In a planar type filter structure a conductor layer in the printed circuit board comprises a periodic pattern with interconnected pattern elements. Each pattern element includes at least one high-impedance portion the inductance of which is dominant over the capacitance against a second conductor layer of the printed circuit board, and at least one low-impedance portion the capacitance of which against the second conductor layer is dominant over the inductance. The high-impedance portions are oblong strip conductors with a ratio of length and surface area such that the inductance seen by the longitudinal electric current in the strip conductor is dominant over the capacitance of the strip conductor. The low-impedance portion is a conductive region with an area/maximum diameter ratio so large that the capacitance is dominant over the inductance. In this document, the maximum diameter of a region refers to the greatest possible distance between two points belonging to the region. The high-impedance and low-impedance portions of the interconnected pattern elements form a filter capable of suppressing spurious signals coupled between the conductor layers. PCB-integrated electromagnetic band-gap filter structures can be implemented using a cascade structure in which various periodic patterns and/or various sub-regions of a mushroom type filter structure are connected one after another. The cascade structure allows the implementation of stop-bands of a desired width, for example. A limitation of the cascade structure is, however, that the characteristics achieved through the cascade are present only in conjunction with spurious signals the propagation direction of which is substantially the same as the direction where the various periodic patterns and/or various sub-regions of a mushroom type filter structure are cascaded.

An advantage of a planar type filter structure over a mushroom type filter structure is that in a planar type filter structure there is no need for inter-layer conductive regions and feedthrough connections which complicate the printed circuit board and increase manufacturing costs. A drawback of a planar type filter structure is that in addition to the electric current which represents noise, also the electric current which represents the useful signal or the transfer of power flows through the above-mentioned oblong strip conductors, whereby the resistance of the strip conductors limits the power transfer capacity of the filter structure. Considering the power transfer capacity of a filter structure, the oblong strip conductors should therefore be as short and wide as possible. However, the length/width ratio of the strip conductors must be sufficiently large for the stop-band of the filter structure to be wide enough. Publication US2008072204 discloses a solution with meandering striplines to achieve sufficient length for the striplines and, therefore, a stop-band of sufficient width. Making the strip conductors longer increases their resistance and, therefore, degrades the power transfer capacity of the filter structure. So, when designing the length of strip conductors one has to strike a compromise between the power transfer capacity of the filter structure and the width of the stop-band. However, finding a satisfactory compromise between the power transfer capacity and width of the stop-band may in some cases prove difficult.

SUMMARY OF THE INVENTION

The invention is directed to a novel filter structure comprising:
    a first conductor layer,
    a second conductor layer spaced apart from the first conductor layer and substantially parallel to the first conductor layer, and
    a pattern in the first conductor layer with interconnected pattern elements and in each pattern element at least one high-impedance conductor strip with a length/area ratio such that the inductance seen by a longitudinal electric current in the conductor strip is dominant over the capacitance of the conductor strip against the second conductor layer, and a low-impedance conductive region where the ratio of the area and the maximum diameter is such that the capacitance against the second conductor layer is dominant over the inductance of the conductive region,
where at least one of the pattern elements comprises at least two adjacent high-impedance conductor strips in a first direction, with first ends of the conductor strips arranged to connect to a low-impedance conductive region of the at least one pattern element, and at least two adjacent high-impedance conductor strips in a second direction, with first ends of these conductor strips arranged to connect to the low-impedance conductive region, the first direction and the second direction being mutually intersecting.

The at least two high-impedance conductor strips in the first direction and the at least two high-impedance conductor strips in the second direction form together with the low-impedance conductive region a plurality of resonance points within the frequency range. Several resonance points enable a wider stop-band without the need to make the high-impedance conductor strips longer, making it easier to find a satisfactory compromise between the power transfer capacity and width of the stop-band.

The invention is also directed to a novel electronic apparatus having a printed circuit board with at least two conductor layers, with a filter structure according to the invention in the printed circuit board.

The invention is also directed to a novel method for suppressing a spurious signal coupled between a first and a second conductor layer of a printed circuit board, the second conductor layer being spaced apart from the first conductor layer and substantially parallel to the first conductor layer. The method according to the invention makes use of a pattern in the first conductor layer, with interconnected pattern elements in the pattern. In each pattern element there is at least one high-impedance conductor strip with a length/area ratio such that the inductance seen by a longitudinal electric current in the conductor strip is dominant over the capacitance of the conductor strip against the second conductor layer, and a low-impedance conductive region where the ratio of the area and the maximum diameter is such that the capacitance against the second conductor layer is dominant over the inductance. At least one of the pattern elements comprises at least two adjacent high-impedance conductor strips in a first direction, with first ends of the conductor strips arranged to connect to a low-impedance conductive region, and at least two adjacent high-impedance conductor strips in a second direction, with first ends of these conductor strips arranged to connect to the low-impedance conductive region, the first direction and the second direction being mutually intersecting.

The various embodiments of the invention are characterized by that which is specified in the dependent claims.

BRIEF DESCRIPTION OF THE DRAWINGS

Embodiments and advantages of the invention will now be described in closer detail with reference to the embodiments presented as examples and to the accompanying drawings where.

DESCRIPTION OF EMBODIMENTS OF THE INVENTION

Figure 1A:
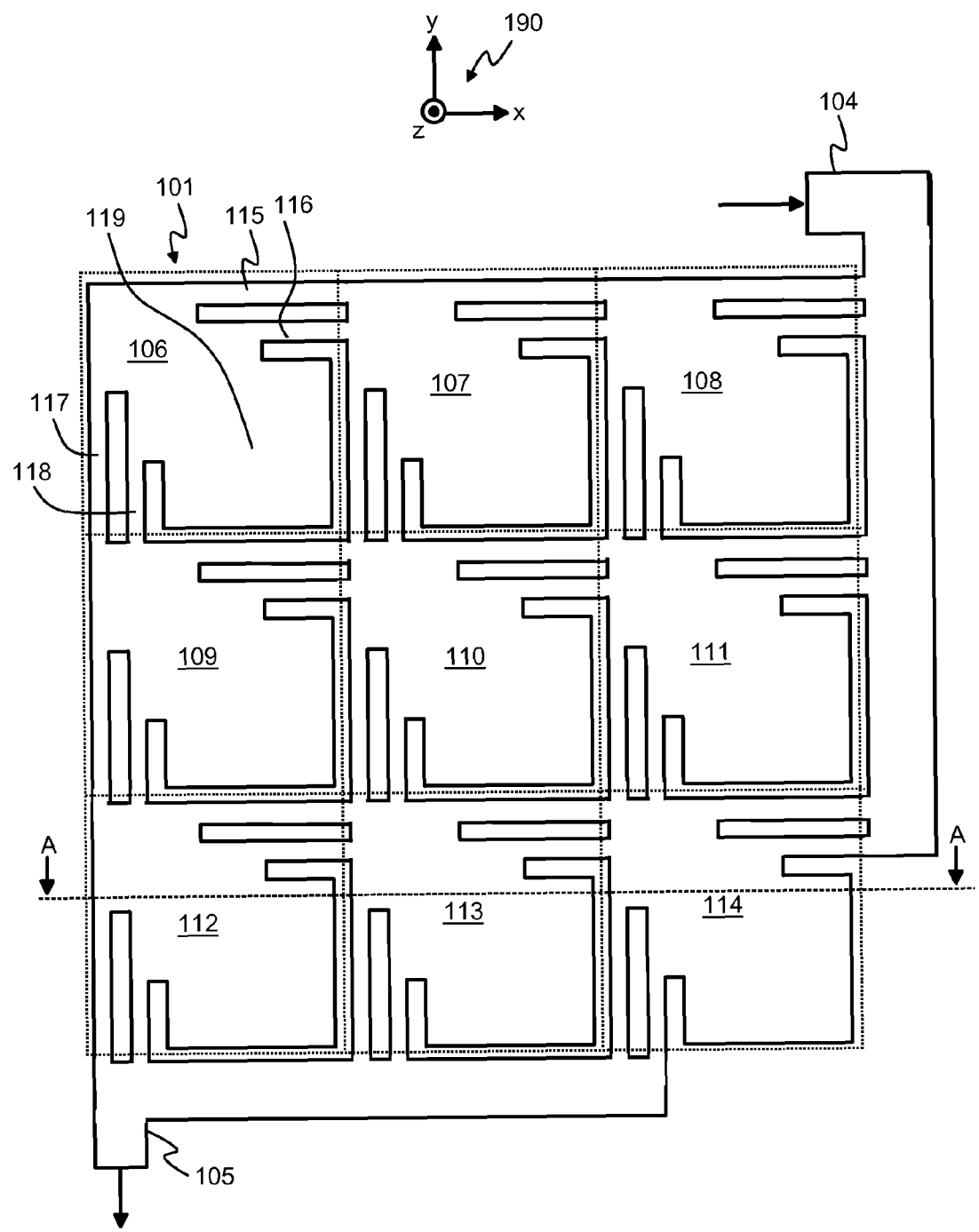
FIGS. 1a and 1b show a filter structure according to an embodiment of the invention as seen from the direction of the normal of the printed circuit board and from the side.
Figure 1B:
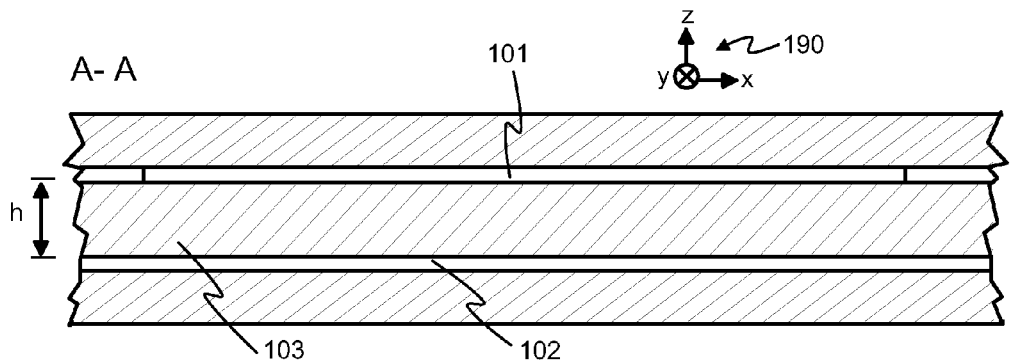

FIG. 1a shows a filter structure according to an embodiment of the invention as seen from the direction of the normal of the printed circuit board. FIG. 1b shows a side view of the filter structure, in a section according to line A-A marked on FIG. 1a. The filter structure comprises a first conductor layer 101 and a second conductor layer 102 (FIG. 1b) spaced apart from the first conductor layer and substantially parallel to the first conductor layer. Between the conductor layers 101 and 102 there is insulating material 103. In the case depicted by FIG. 1b both conductor layers are internal layers in the printed circuit board. This is, however, not necessary, but one or both of the conductor layers may, generally, be a surface conductor layer/surface conductor layers on the printed circuit board.

The first conductor layer 101 has a pattern with interconnected pattern elements 106 to 114. In each pattern element (106 for example) there is a low-impedance conductive region (119 for example) with an area/maximum diameter ratio such that the capacitance against the second conductor layer 102 is dominant over the inductance seen by an electric current flowing in the low-impedance conductive region. Here, "low-impedance" means that the capacitance is dominant over the inductance.

Each pattern element (106 for example) comprises two adjacent high-impedance conductor strips (115 and 116 for example) in a first direction, with first ends of the conductor strips arranged to connect to a low-impedance conductive region (119 for example) of the pattern element, and two adjacent high-impedance conductor strips (117 and 118 for example) in a second direction, with first ends of these conductor strips arranged to connect to the low-impedance conductive region (119 for example). The first direction is substantially parallel to the x-axis of a coordinate system 190, and the second direction is substantially parallel to the y-axis of the coordinate system 190. Thus the angle between the first and second directions is substantially 90 degrees. The z-axis of the coordinate system 190 is parallel to the normal of the printed circuit board. The ratio of length and area of each high-impedance conductor strip is such that the inductance seen by an electric current flowing in the longitudinal direction of the conductor strip is dominant over the capacitance of the conductor strip against the second conductor layer 102. Here, "high-impedance" means that the inductance is dominant over the capacitance.

The periodic pattern of the filter structure is connected to a first terminal 104 and second terminal 105. A signal to be filtered or the supply voltage is brought to the first terminal 104 (or the second terminal 105) and the filtered signal or the supply voltage is obtained from the second terminal 105 (or the first terminal 104).

Two high-impedance conductor strips (115 and 116 for example) in a first direction and two high-impedance conductor strips (117 and 118 for example) in a second direction form together with a low-impedance conductive region (119 for example) a plurality of resonance points within the frequency range. Several resonance points enable a wide enough stop-band without the need to make the high-impedance conductor strips longer. This makes it easier to find a satisfactory compromise between the power transfer capacity of the filter structure and the width of the stop-band. It is also advantageous from the power transfer capacity point of view that the high-impedance conductor strips (115 and 116 for example) in the first direction (x) form a parallel coupling in the filter structure, and the high-impedance conductor strips (117 and 118 for example) in the second direction (y) form a parallel coupling in the filter structure.

Figure 1C:
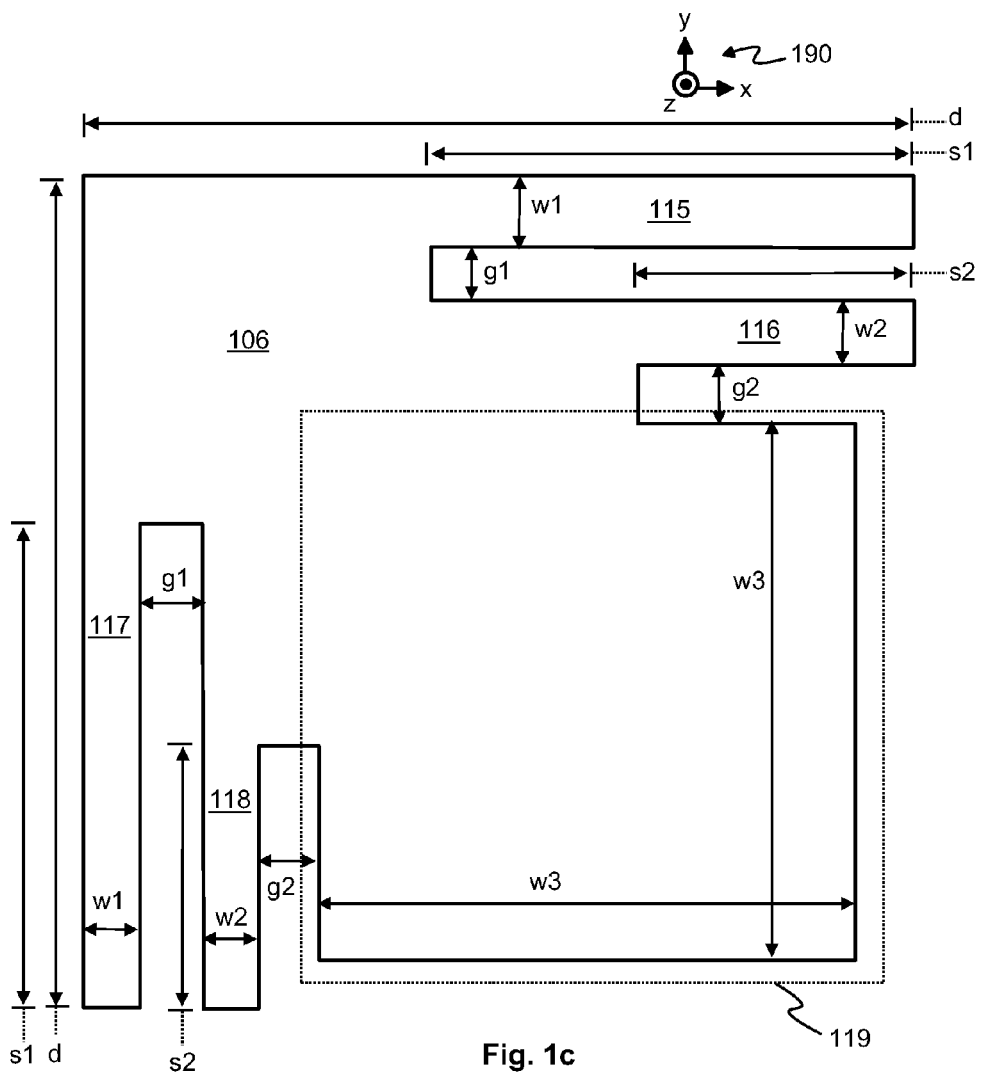
FIG. 1c shows a pattern element of the filter structure shown in FIGS. 1a and 1b, FIGS. 2a and 2b show a filter structure according to an embodiment of the invention as seen from the direction of the normal of the printed circuit board, and a simulated transducer gain of the filter structure as a function of frequency.

FIG. 1c shows a pattern element of the filter structure shown in FIGS. 1a and 1b. The frequency response of the filter structure can be shaped and optimized by choosing suitable values for the thickness h of the insulating material 103, as shown in FIG. 1b, and for the dimensions d, s1, s2, w1, w2, w3, g1 and g2, as shown in FIG. 1c. The electromagnetic properties of the insulating materials surrounding the conductor layers 101 and 102 also influence the frequency response of the filter structure.

In a filter structure according to an embodiment of the invention the high-impedance conductor strips 115 and 116 in the first direction have mutually unequal lengths, and the high-impedance conductor strips 117 and 118 in the second direction have mutually unequal lengths. In the case depicted by FIG. 1c, s1 is then unequal to s2.

In a filter structure according to an embodiment of the invention the longest one of the high-impedance conductor strips 115 in the first direction and the longest one of the high-impedance conductor strips 117 in the second direction have a length which is 0.4 to 0.6 times the length of the side of the smallest possible square that can encircle the corresponding pattern element 106. In the case depicted by FIG. 1, s1 then equals 0.4 to 0.6 times d.

In a filter structure according to an embodiment of the invention the shortest one of the high-impedance conductor strips 116 in the first direction and the shortest one of the high-impedance conductor strips 118 in the second direction have a length which is 0.2 to 0.3 times the length of the side of the smallest possible square that can encircle the corresponding pattern element 106. In the case depicted by FIG. 1, s2 then equals 0.2 to 0.3 times d.

In a filter structure according to an embodiment of the invention the longest one of the high-impedance conductor strips 115 in the first direction has a length which is substantially 0.5 times the length of the side of the smallest possible square that can encircle the corresponding pattern element 106, and the shortest one of the high-impedance conductor strips 116 in the first direction has a length which is substantially 0.25 times the length of the side of the said square. Similarly, the longest one of the high-impedance conductor strips 117 in the second direction has a length which is substantially 0.5 times the length of the side of the said square, and the shortest one of the high-impedance conductor strips 118 in the second direction has a length which is substantially 0.25 times the length of the side of the said square. In the case depicted by FIG. 1, s1 then substantially equals 0.5×d, and s2 substantially equals 0.25×d.

In a filter structure according to an embodiment of the invention the perpendicular distance between the high-impedance conductor strips 115 and 116 in the first direction substantially equals the width of the high-impedance conductor strips in the first direction, and the perpendicular distance between the high-impedance conductor strips 117 and 118 in the second direction substantially equals the width of the high-impedance conductor strips in the second direction. Thus in the case depicted by FIG. 1, g1=w1=w2.

In FIG. 1a, each pattern element 106 to 114 comprises two adjacent high-impedance conductor strips in the first direction and two adjacent high-impedance conductor strips in the second direction. It should be noted that in some situations, sufficient filtering can be achieved already by a structure in which only one pattern element has two adjacent high-impedance conductor strips in the first direction and two adjacent high-impedance conductor strips in the second direction. In other words, the multiresonance effect is achieved in one pattern element only.

Figure 2A:
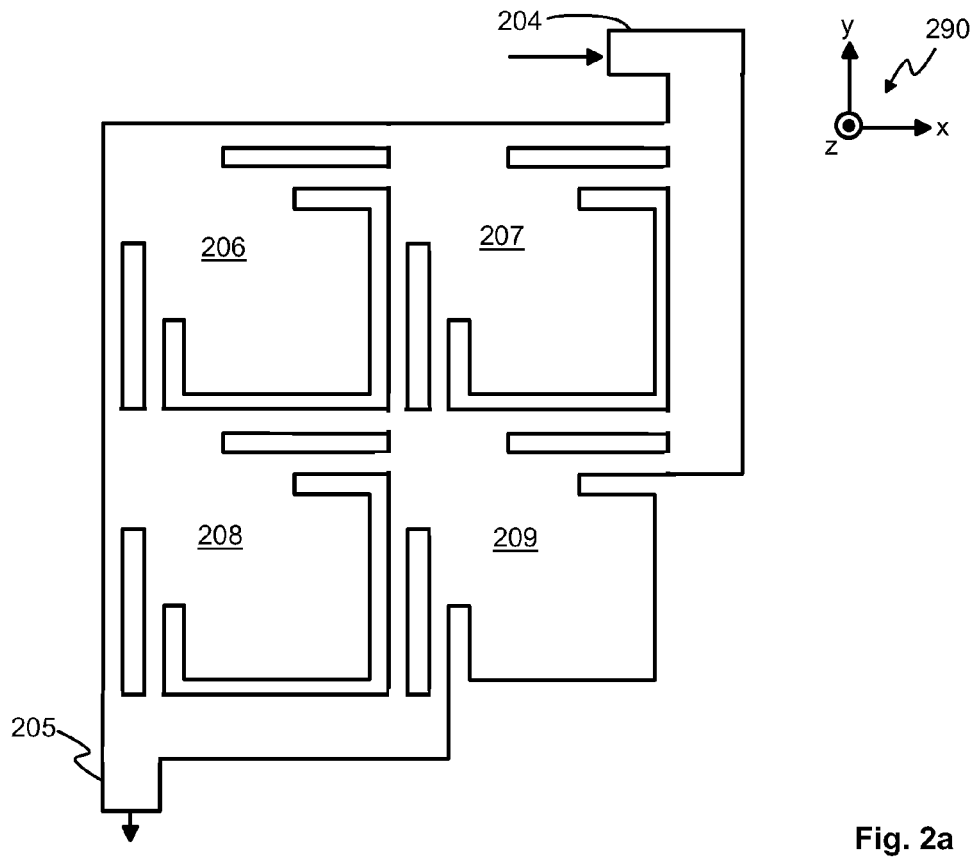

FIG. 2a shows a filter structure according to an embodiment of the invention as seen from the direction of the normal of the printed circuit board. In the filter structure, a conductor layer of a printed circuit board has a pattern which comprises pattern elements 206 to 209. Each pattern element has similar portions as the pattern element shown in FIG. 1c. The pattern elements are in a 2×2 formation. Pattern elements 207 and 209 are connected to a first terminal 204, and pattern elements 208 and 209 are connected to a second terminal 205. A signal to be filtered or the supply voltage is brought to the first terminal 204 (or the second terminal 205) and the filtered signal or the supply voltage is obtained from the second terminal 205 (or the first terminal 204).

Figure 2B:
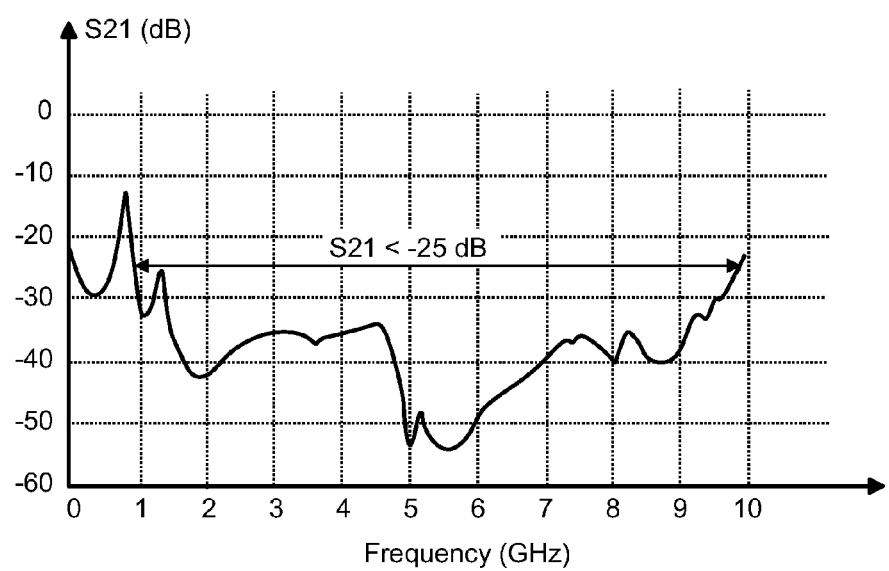

FIG. 2b shows a simulated transducer gain S21 as a function of frequency for the filter structure shown in FIG. 2a on a decibel scale in a situation where the dimensions of the pattern elements 206 to 209 are as follows (the quantities representing the dimensions are shown in FIG. 1c):

d=15 mm,
w1=w2=g1=g2=0.25 mm,
w3=13.75 mm,
s1=7.5 mm,
s2=3.75 mm, and the patterned conductor layer is positioned between two solid conductor layers such that the perpendicular distance of the patterned conductor layer from both solid conductor layers is 0.1 mm. The transducer gain S21 shown in FIG. 2b is suggestive only, because the transducer gain is obtained from a computational simulation which involves simplifying assumptions. However, the accuracy of the transducer gain shown in FIG. 2b is sufficient to illustrate the desired broadband filtering effect.

Figure 3:
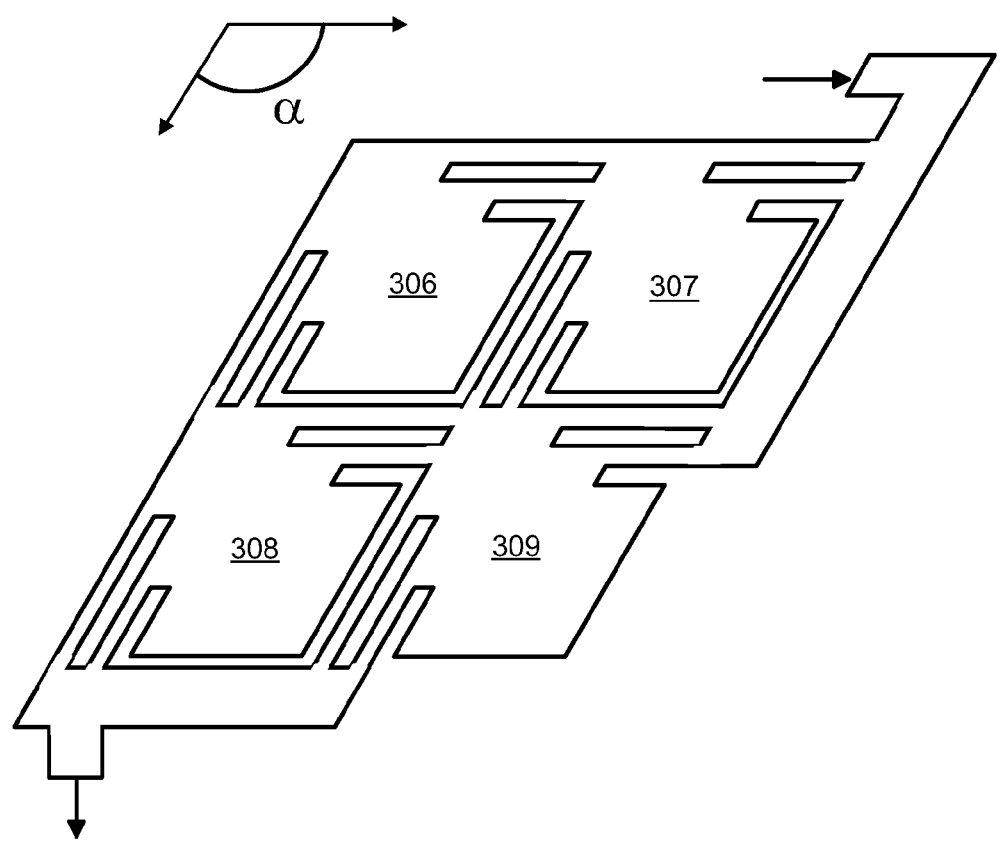
FIG. 3 shows a filter structure according to an embodiment of the invention as seen from the direction of the normal of the printed circuit board.

In the structures shown in FIGS. 1a and 2a, the pattern elements have two adjacent high-impedance conductor strips in the first direction and two adjacent high-impedance conductor strips in the second direction such that the angle between the first and second directions is substantially 90 degrees. It should be noted that the angle need not necessarily be 90 degrees. FIG. 3 shows a filter structure where the angle α in the pattern elements 306 to 309 is approximately 120 degrees. The angle α is advantageously between 90 and 120 degrees.

Figure 4:
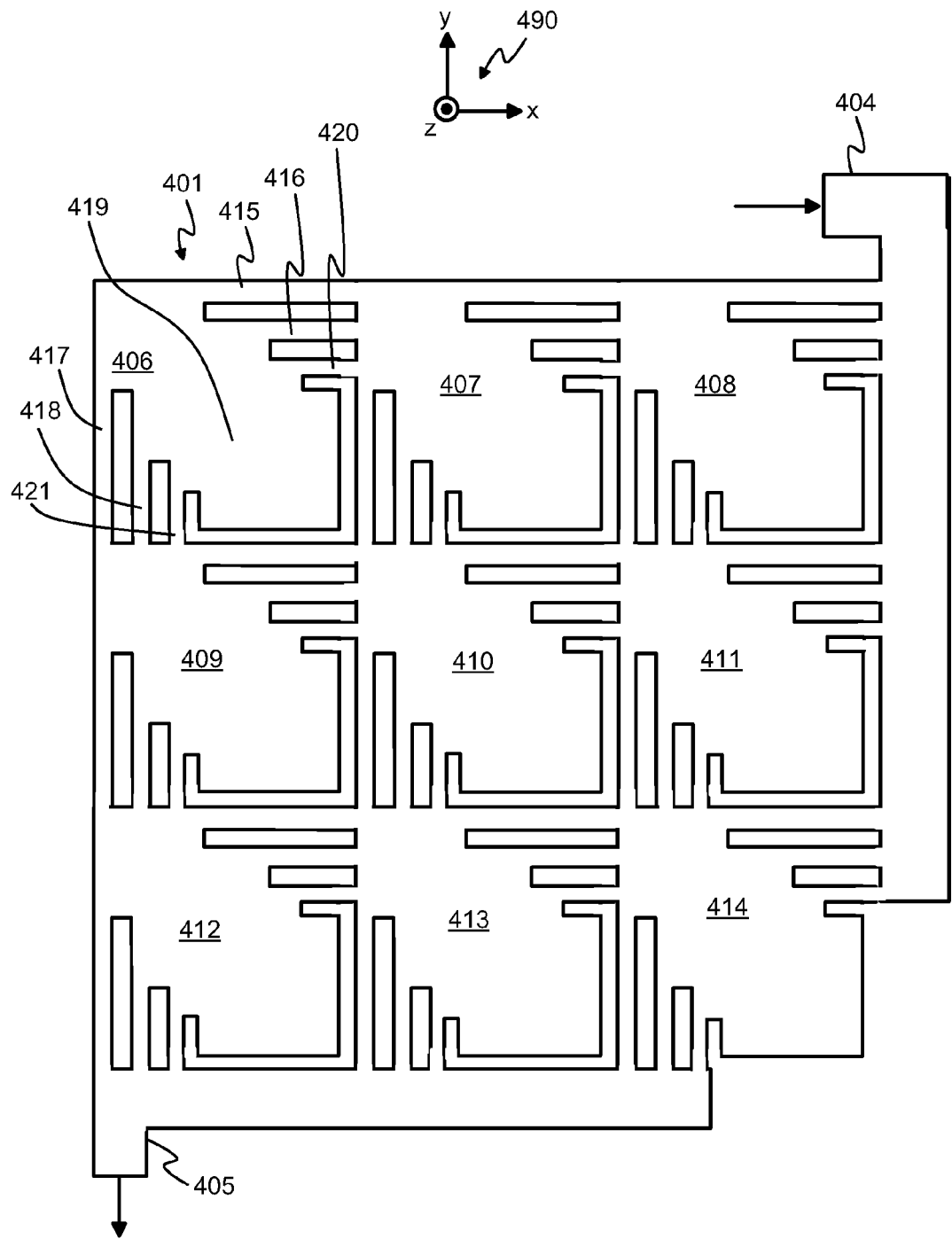
FIG. 4 shows a filter structure according to an embodiment of the invention as seen from the direction of the normal of the printed circuit board.

FIG. 4 shows a filter structure according to an embodiment of the invention as seen from the direction of the normal of the printed circuit board. The filter structure comprises a first conductor layer 101 and a second conductor layer (not shown in FIG. 4) spaced apart from the first conductor layer and substantially parallel to the first conductor layer. The first conductor layer 401 has a pattern with interconnected pattern elements 406 to 414. In each pattern element (406 for example) there is a low-impedance conductive region (419 for example) with an area/maximum diameter ratio such that the capacitance against the second conductor layer is dominant over the inductance seen by an electric current flowing in the low-impedance conductive region. Each pattern element (406 for example) comprises three adjacent high-impedance conductor strips (415, 416, and 420, for example) in a first direction, with first ends of the conductor strips arranged to connect to a low-impedance conductive region (419 for example) of the pattern element, and three adjacent high-impedance conductor strips (417, 418, and 421, for example) in a second direction, with first ends of these conductor strips arranged to connect to the low-impedance conductive region (419 for example). The first direction is substantially parallel to the x-axis of a coordinate system 490, and the second direction is substantially parallel to the y-axis of the coordinate system 490. Thus the angle between the first and second directions is substantially 90 degrees. The ratio of length and area of each high-impedance conductor strip is such that the inductance seen by an electric current flowing in the longitudinal direction of the conductor strip is dominant over the capacitance of the conductor strip against the second conductor layer. The periodic pattern of the filter structure is connected to a first terminal 404 and second terminal 405. A signal to be filtered or the supply voltage is brought to the first terminal 404 (or the second terminal 405) and the filtered signal or the supply voltage is obtained from the second terminal 405 (or the first terminal 404).

In the structures shown in FIGS. 1*a*, 2*a*, and 3, the number of adjacent high-impedance conductor strips is two, and in the structure shown in FIG. 4 the number of adjacent high-impedance conductor strips is three. It should be noted that in a solution according to an embodiment of the invention the number of adjacent high-impedance conductor strips could be more than three, it could be four, for example. It is also advantageous from the point of view of the power transfer capacity of the filter structure that the high-impedance conductor strips (415, 416, and 420, for example) in the first direction form a parallel coupling in the filter structure, and, similarly, the high-impedance conductor strips (417, 418, and 421, for example) in the second direction form a parallel coupling in the filter structure, as in embodiments of the invention depicted in FIGS. 1*a*, 2*a*, 3, and 4.

Figure 5:
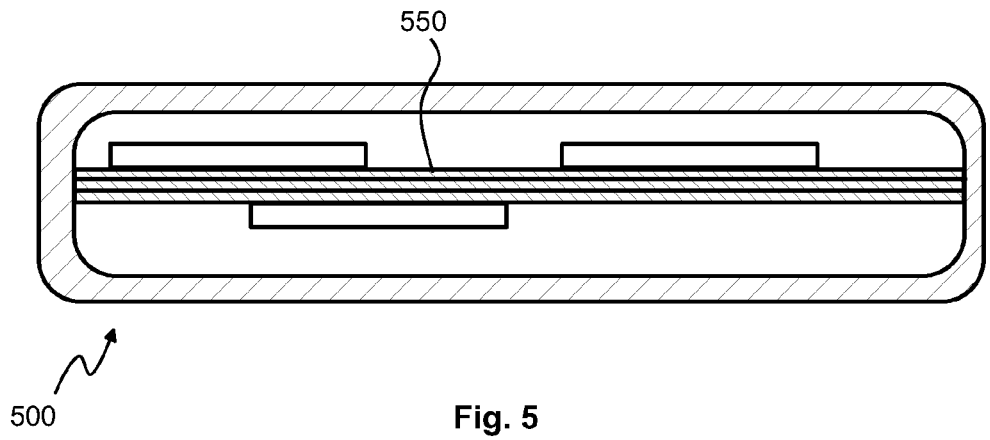
FIG. 5 shows a longitudinal section of an electronic apparatus according to an embodiment of the invention.

FIG. 5 shows a longitudinal section of an electronic apparatus 500 according to an embodiment of the invention, which apparatus could be e.g. an IP (Internet Protocol) router, a multiprotocol label switching device (MPLS), an ATM (Asynchronous Transfer Mode) switch, an Ethernet switch or a combination of any of the above. The electronic apparatus includes a printed circuit board 550 comprising at least two conductor layers with a filter structure according to an embodiment of the invention for suppressing spurious signals coupled between the conductor layers. The filter structure may be e.g. like the one depicted in FIGS. 1*a* and 1*b*, FIG. 2*a*, FIG. 3 or FIG. 4.

In an electronic apparatus according to an embodiment of the invention the filter structure is implemented in one or more power supply layers of the printed circuit board.

In an electronic apparatus according to an embodiment of the invention the filter structure is implemented in one or more signal transmission layers of the printed circuit board.

Figure 6:
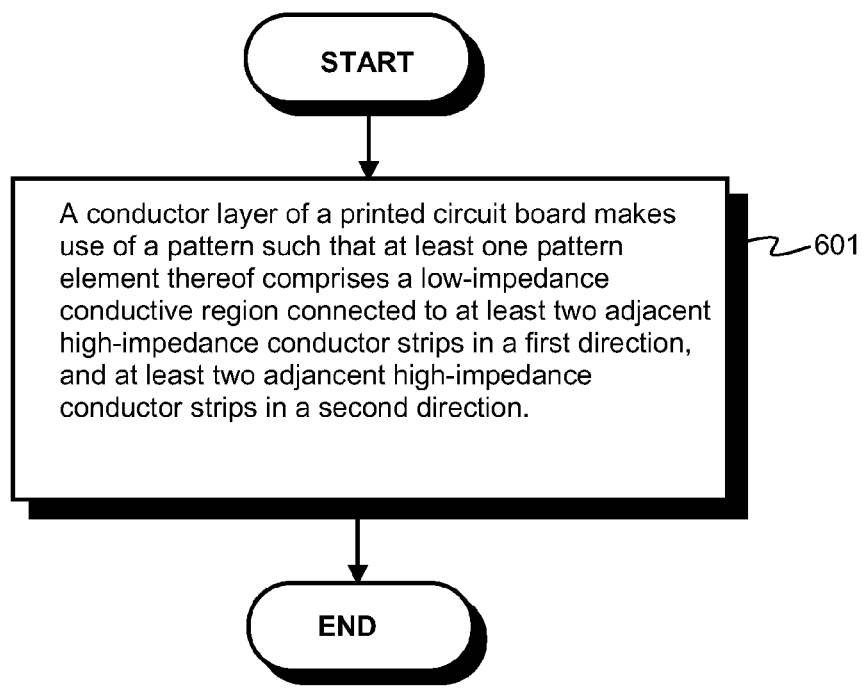
FIG. 6 shows a flow diagram of a method according to an embodiment of the invention for suppressing a spurious signal coupled between the conductor layers of a printed circuit board.

FIG. 6 shows a flow diagram of a method according to an embodiment of the invention for suppressing a spurious signal coupled between the first and second conductor layers of a printed circuit board. The second conductor layer is spaced apart from the first conductor layer and substantially parallel to the first conductor layer. The method makes use (step 601) of a pattern in the first conductor layer, with interconnected pattern elements in the pattern. In each pattern element there is at least one high-impedance conductor strip with a length/area ratio such that the inductance seen by a longitudinal electric current in the conductor strip is dominant over the capacitance of the conductor strip against the second conductor layer, and a low-impedance conductive region where the ratio of the area and the maximum diameter is such that the capacitance against the second conductor layer is dominant over the inductance. At least one of the pattern elements comprises at least two adjacent high-impedance conductor strips in a first direction, with first ends of the conductor strips arranged to connect to a low-impedance conductive region, and at least two adjacent high-impedance conductor strips in a second direction, with first ends of these conductor strips arranged to connect to the low-impedance conductive region, the first direction and the second direction being mutually intersecting.

In a method according to an embodiment of the invention the angle between the first and second directions is between 90 and 120 degrees.

In a method according to an embodiment of the invention the angle between the first and second directions is substantially 90 degrees.

In a method according to an embodiment of the invention the high-impedance conductor strips in the first direction have mutually unequal lengths, and the high-impedance conductor strips in the second direction have mutually unequal lengths.

In a method according to an embodiment of the invention the longest one of the high-impedance conductor strips in the first direction and the longest one of the high-impedance conductor strips in the second direction have lengths which are 0.4 to 0.6 times the length of the side of the smallest possible square that can encircle the corresponding pattern element.

In a method according to an embodiment of the invention the shortest one of the high-impedance conductor strips in the first direction and the shortest one of the high-impedance conductor strips in the second direction have lengths which are 0.2 to 0.3 times the length of the side of the smallest possible square that can encircle the corresponding pattern element.

In a method according to an embodiment of the invention the perpendicular distance between the high-impedance conductor strips in the first direction substantially equals the width of the high-impedance conductor strips in the first direction, and the perpendicular distance between the high-impedance conductor strips in the second direction substantially equals the width of the high-impedance conductor strips in the second direction.

In a method according to an embodiment of the invention the first conductor layer is the power supply layer of the printed circuit board and the second conductor layer is the ground plane of the power supply of the printed circuit board.

In a method according to an embodiment of the invention the first conductor layer is a signal transmission layer of the printed circuit board and the second conductor layer is the signal ground plane of the printed circuit board.

In a method according to an embodiment of the invention the longest one of the high-impedance conductor strips in the first direction has a length which is substantially 0.5 times the length of the side of the smallest possible square that can encircle the corresponding pattern element, and the shortest one of the high-impedance conductor strips in the first direction has a length which is substantially 0.25 times the length of the side of the said square. Similarly, the longest one of the high-impedance conductor strips in the second direction has a length which is substantially 0.5 times the length of the side of the said square, and the shortest one of the high-impedance conductor strips in the second direction has a length which is substantially 0.25 times the length of the side of the said square.

As is obvious to a person skilled in the art, the invention and its embodiments are not limited to the exemplary embodiments described above, but the invention and its embodiments can be modified. Expressions used in the claims, such as "the filter structure comprises a first conductor layer", which describe the existence of characteristic features are non-exclusive so that a mention of a characteristic feature shall not exclude the existence of other characteristic features not mentioned in the claims.

What is claimed is:

1. A filter structure comprising:
   a first conductor layer,
   a second conductor layer spaced apart from the first conductor layer and substantially parallel to the first conductor layer, and
   a pattern in the first conductor layer with interconnected pattern elements and in each pattern element at least one high-impedance conductor strip with a length/area ratio such that an inductance seen by a longitudinal electric current in the at least one high-impedance conductor strip is dominant over a capacitance of the at least one high-impedance conductor strip against the second conductor layer, and a low-impedance conductive region where a ratio of an area of the low-impedance conductive region and a maximum diameter of the low-impedance conductive region is such that a capacitance of the low-impedance conductive region against the second conductor layer is dominant over an inductance of the low-impedance conductive region,
   wherein, in at least one of the pattern elements, the at least one high impedance conductor strip comprises at least two mutually adjacent first high-impedance conductor strips in a first direction, with first ends of the first high-impedance conductor strips arranged to connect directly to the low-impedance conductive region of the at least one pattern element, and the at least one high impedance conductor strip further comprises at least two mutually adjacent second high-impedance conductor strips in a second direction, with first ends of these second high-impedance conductor strips arranged to connect directly to the low-impedance conductive region, the first direction and the second direction being mutually intersecting, and
   wherein an electrical current path from the first ends of the first high-impedance conductor strips via the low-impedance conductive region to the first ends of the second high-impedance conductor strips is free from high-impedance conductor strips whose length/area ratio is such that an inductance seen by longitudinal electric current in the high impedance conductor strips is dominant over a capacitance of the high impedance conductor strips against the second conductor layer.

2. A filter structure according to claim 1, wherein an angle between the first and second directions is in a range of 90 to 120 degrees.

3. A filter structure according to claim 1, wherein an angle between the first and second directions is substantially 90 degrees.

4. A filter structure according to claim 1, wherein the first high-impedance conductor strips in the first direction have lengths that are mutually unequal, and the second high-impedance conductor strips in the second direction have lengths that are mutually unequal.

5. A filter structure according to claim 1, wherein a longest one of the first high-impedance conductor strips in the first direction and a longest one of the second high-impedance conductor strips in the second direction have lengths which are 0.4 to 0.6 times a length of a side of a smallest possible square which can encircle the corresponding pattern element.

6. A filter structure according to claim 5, wherein a shortest one of the first high-impedance conductor strips in the first direction and a shortest one of the second high-impedance conductor strips in the second direction have lengths which are 0.2 to 0.3 times the length of the side of the smallest possible square which can encircle the corresponding pattern element.

7. A filter structure according to claim 1, wherein a perpendicular distance between the first high-impedance conductor strips in the first direction substantially equals a width of the first high-impedance conductor strips in the first direction, and a perpendicular distance between the second high-impedance conductor strips in the second direction substantially equals a width of the second high-impedance conductor strips in the second direction.

8. An electronic apparatus comprising a printed circuit board comprising a filter structure comprising:
   a first conductor layer,
   a second conductor layer spaced apart from the first conductor layer and substantially parallel to the first conductor layer, and
   a pattern in the first conductor layer with interconnected pattern elements and in each pattern element at least one high-impedance conductor strip with a length/area ratio such that an inductance seen by a longitudinal electric current in the at least one high-impedance conductor strip is dominant over a capacitance of the at least one high-impedance conductor strip against the second conductor layer, and a low-impedance conductive region where a ratio of an area of the low-impedance conductive region and a maximum diameter of the low-impedance conductive region is such that a capacitance of the low-impedance conductive region against the second conductor layer is dominant over an inductance of the low-impedance conductive region,
   wherein, in at least one of the pattern elements, the at least one high impedance conductor strip comprises at least two mutually adjacent first high-impedance conductor strips in a first direction, with first ends of the first high-impedance conductor strips arranged to connect directly to the low-impedance conductive region of the at least one pattern element, and the at least one high impedance conductor strip further comprises at least two mutually adjacent second high-impedance conductor strips in a second direction, with first ends of these second high-impedance conductor strips arranged to connect directly to the low-impedance conductive region, the first direction and the second direction being mutually intersecting, and
   wherein an electrical current path from the first ends of the first high-impedance conductor strips via the low-impedance conductive region to the first ends of the second high-impedance conductor strips is free from high-impedance conductor strips whose length/area ratio is such that an inductance seen by longitudinal electric current in the high impedance conductor strips is dominant over a capacitance of the high impedance conductor strips against the second conductor layer.

9. An electronic apparatus according to claim 8, wherein the filter structure is implemented in one or more power supply layers of the printed circuit board.

10. An electronic apparatus according to claim 8, wherein the filter structure is implemented in one or more signal transmission layers of the printed circuit board.

11. An electronic apparatus according to claim 8, wherein the electronic apparatus is at least one of the following: an IP (Internet Protocol) router, a multiprotocol label switching device (MPLS), an ATM (Asynchronous Transfer Mode) switch, and an Ethernet switch.

12. A method for suppressing a spurious signal coupled between a first and a second conductor layer of a printed circuit board, the second conductor layer being spaced apart from the first conductor layer and substantially parallel to the first conductor layer, the method comprising:

using a pattern in the first conductor layer with interconnected pattern elements, each pattern element comprising at least one high-impedance conductor strip with a length/area ratio such that an inductance seen by a longitudinal electric current in the at least one high-impedance conductor strip is dominant over a capacitance of the at least one high-impedance conductor strip against the second conductor layer, and a low-impedance conductive region where a ratio of an area of the low-impedance conductive region and a maximum diameter of the low-impedance conductive region is such that a capacitance of the low-impedance conductive region against the second conductor layer is dominant over an inductance of the low-impedance conductive region, wherein, in at least one of the pattern elements, the at least one high impedance conductor strip comprises at least two mutually adjacent first high-impedance conductor strips in a first direction, with first ends of the first high-impedance conductor strips arranged to connect directly to the low-impedance conductive region of the at least one pattern element, and the at least one high impedance conductor strip further comprises at least two mutually adjacent second high-impedance conductor strips in a second direction, with first ends of these second high-impedance conductor strips arranged to connect directly to the low-impedance conductive region, the first direction and the second direction being mutually intersecting, and wherein an electrical current path from the first ends of the first high-impedance conductor strips via the low-impedance conductive region to the first ends of the second high-impedance conductor strips is free from high-impedance conductor strips whose length/area ratio is such that an inductance seen by longitudinal electric current in the high impedance conductor strips is dominant over a capacitance of the high impedance conductor strips against the second conductor layer.

13. A method according to claim 12, wherein an angle between the first and second directions is in a range of 90 to 120 degrees.

14. A method according to claim 12, wherein an angle between the first and second directions is substantially 90 degrees.

15. A method according to claim 12, wherein the first high-impedance conductor strips in the first direction have lengths that are mutually unequal, and the second high-impedance conductor strips in the second direction have lengths that are mutually unequal.

16. A method according to claim 12, wherein a longest one of the first high-impedance conductor strips in the first direction and a longest one of the second high-impedance conductor strips in the second direction have lengths which are 0.4 to 0.6 times a length of a side of a smallest possible square which can encircle the corresponding pattern element.

17. A method according to claim 16, wherein a shortest one of the first high-impedance conductor strips in the first direction and a shortest one of the second high-impedance conductor strips in the second direction have lengths which are 0.2 to 0.3 times the length of the side of the smallest possible square which can encircle the corresponding pattern element.

18. A method according to claim 12, wherein a perpendicular distance between the first high-impedance conductor strips in the first direction substantially equals a width of the first high-impedance conductor strips in the first direction, and a perpendicular distance between the second high-impedance conductor strips in the second direction substantially equals a width of the second high-impedance conductor strips in the second direction.

19. A method according to claim 12, wherein the first conductor layer is a power supply layer of the printed circuit board and the second conductor layer is a power supply ground plane of the printed circuit board.

20. A method according to claim 12, wherein the first conductor layer is a signal transmission layer of the printed circuit board and the second conductor layer is a signal ground plane of the printed circuit board.

* * * * *